United States Patent
Yang et al.

(10) Patent No.: US 8,724,326 B2
(45) Date of Patent: May 13, 2014

(54) HEAT DISSIPATION STRUCTURE

(75) Inventors: Chih-Hao Yang, New Taipei (TW); Bao-Quan Shi, Shenzhen (CN); Rong Yang, Shenzhen (CN); Xiang-Kun Zeng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 121 days.

(21) Appl. No.: 13/456,498

(22) Filed: Apr. 26, 2012

(65) Prior Publication Data

US 2013/0155624 A1 Jun. 20, 2013

(30) Foreign Application Priority Data

Dec. 16, 2011 (CN) .......................... 2011 1 0423220

(51) Int. Cl.
*H05K 7/20* (2006.01)

(52) U.S. Cl.
USPC ........... 361/709; 361/704; 361/710; 361/719; 165/80.3; 165/185; 174/16.3

(58) Field of Classification Search
USPC ................... 361/679.54, 704, 709–710, 719; 165/80.2–80.3, 185; 174/16.3
See application file for complete search history.

(56) References Cited

U.S. PATENT DOCUMENTS

| | | | |
|---|---|---|---|
| 6,477,050 B1 * | 11/2002 | Herring et al. | 361/704 |
| 7,310,229 B2 * | 12/2007 | Lee et al. | 361/697 |
| 2013/0163207 A1 * | 6/2013 | Chen et al. | 361/720 |

* cited by examiner

*Primary Examiner* — Robert J Hoffberg
(74) *Attorney, Agent, or Firm* — Novak Druce Connolly Bove + Quigg LLP

(57) ABSTRACT

A heat dissipation structure includes a heat sink having a base formed with four securing tabs laterally extending from four corners of the base. Four positioning posts upwardly protrude from a printed circuit board. Four spring clips are attached to the four positioning posts respectively. Each of the four spring clips has a resilient piece for exerting a downward force to press a corresponding securing tab, thereby securing the heat sink to the printed circuit board.

20 Claims, 6 Drawing Sheets

HEAT DISSIPATION STRUCTURE

BACKGROUND

1. Technical Field

The present disclosure generally relates to heat dissipation structures, and particularly relates to heat dissipation structures for dissipating heat generated by electronic components in computers.

2. Description of Related Art

Electronic components, such as central processing units (CPUs), in a computer may generate a lot of heat during normal operation. Excess heat may deteriorate the operational stability of the electronic components and may damage the electronic components. Thus, excess heat must be removed quickly to maintain an acceptable operating temperature of the CPUs and other electronic components in the computer. One known method for removing heat from the CPU is by mounting a heat sink on the CPU. Common methods of mounting a heat sink include attaching screws with a screwdriver which may be time-consuming and troublesome, since the screws can be easily lost. Moreover, if a screw falls on a printed circuit board and is not noticed, the printed circuit board may short out and a great amount of damage may be done to the computer when the computer is switched on.

With the above described disadvantages in view, a need may be desired to provide an improved heat dissipation structure.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
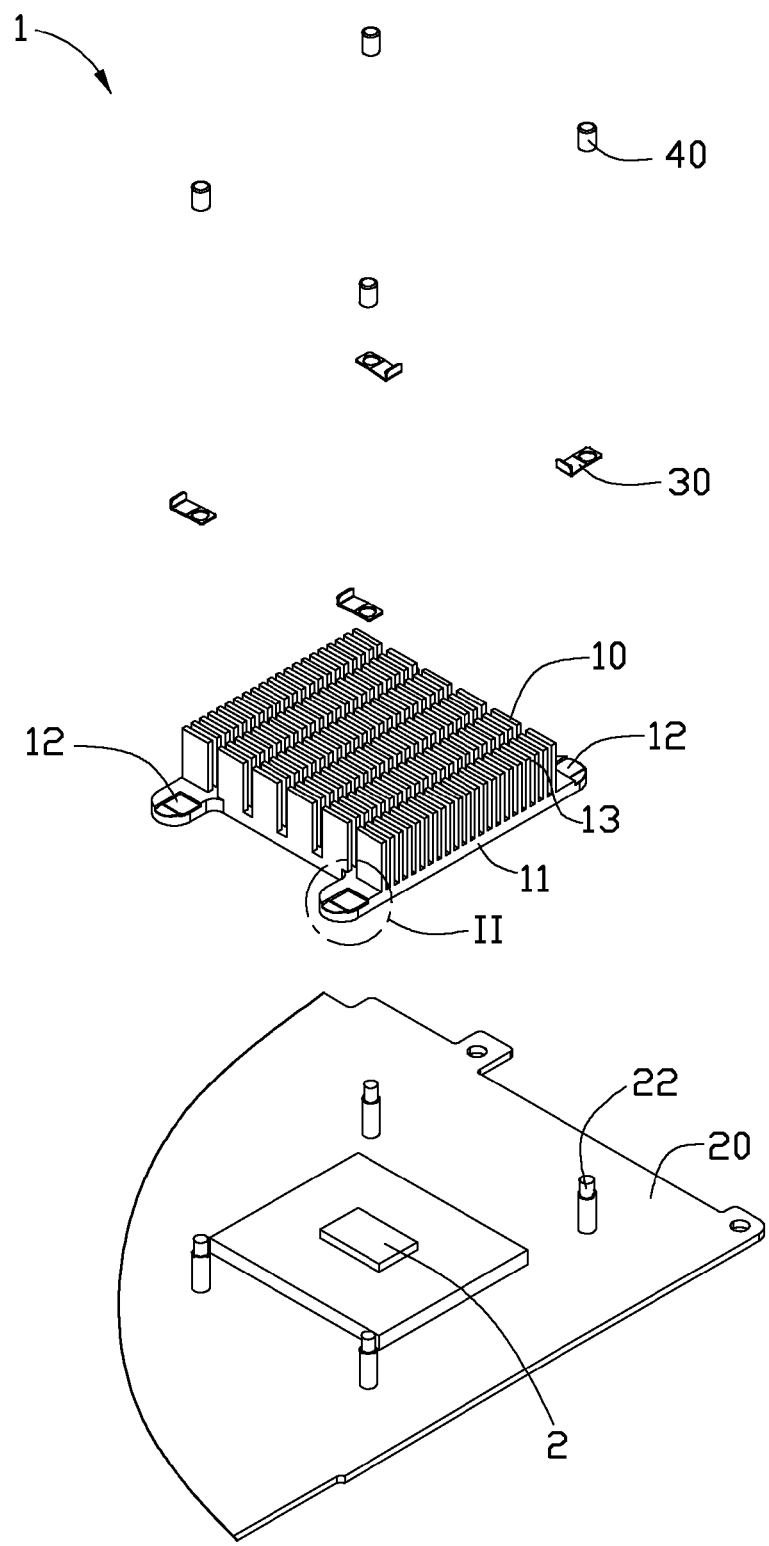
FIG. 1 is an exploded, isometric view of a heat dissipation structure in accordance with an embodiment.
Figure 2:
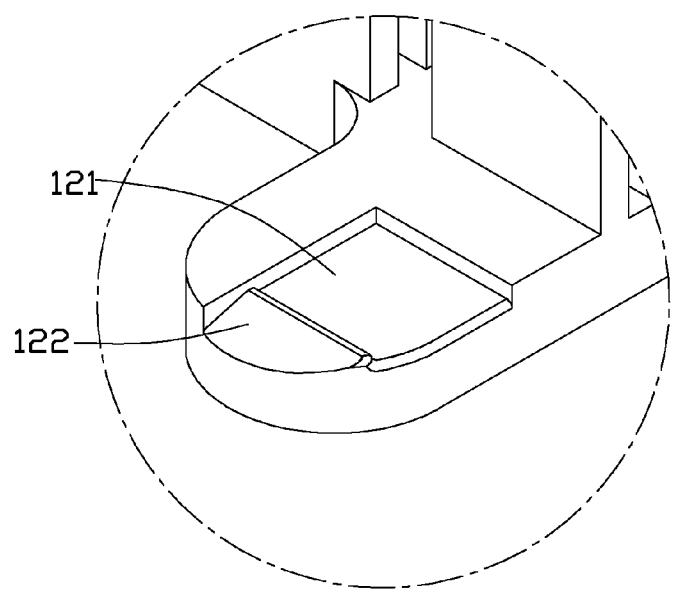
FIG. 2 is an enlarged view of a circled portion II of FIG. 1.
Figure 3:
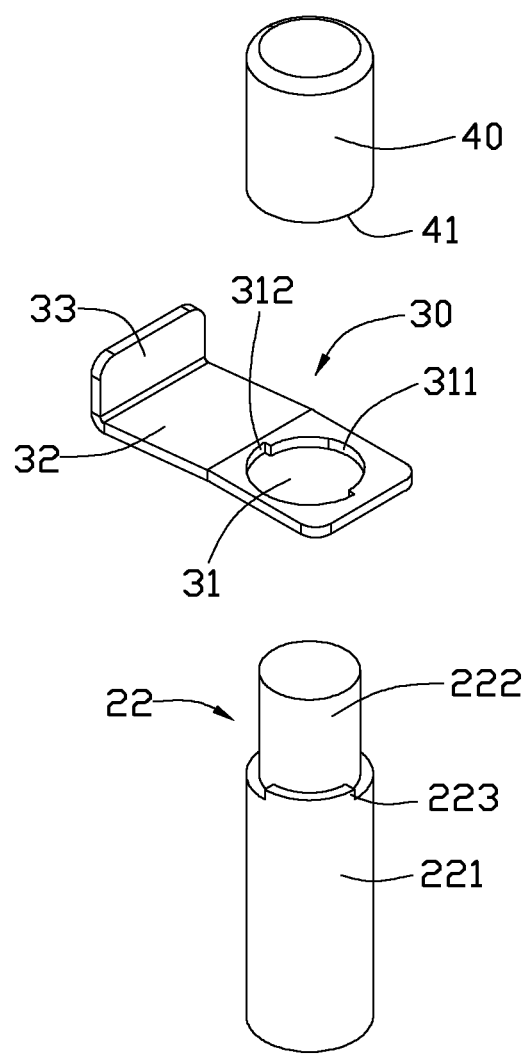
FIG. 3 is a perspective view of a positioning post, a spring clip and a securing cap of FIG. 1.
Figure 4:
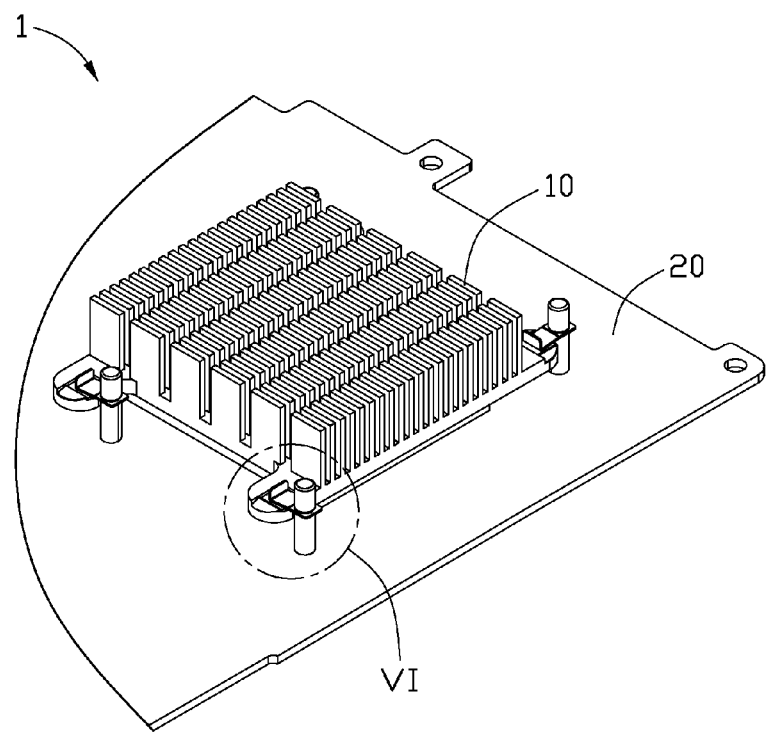
FIG. 4 is an assembled view of the heat dissipation structure of FIG. 1.
Figure 5:
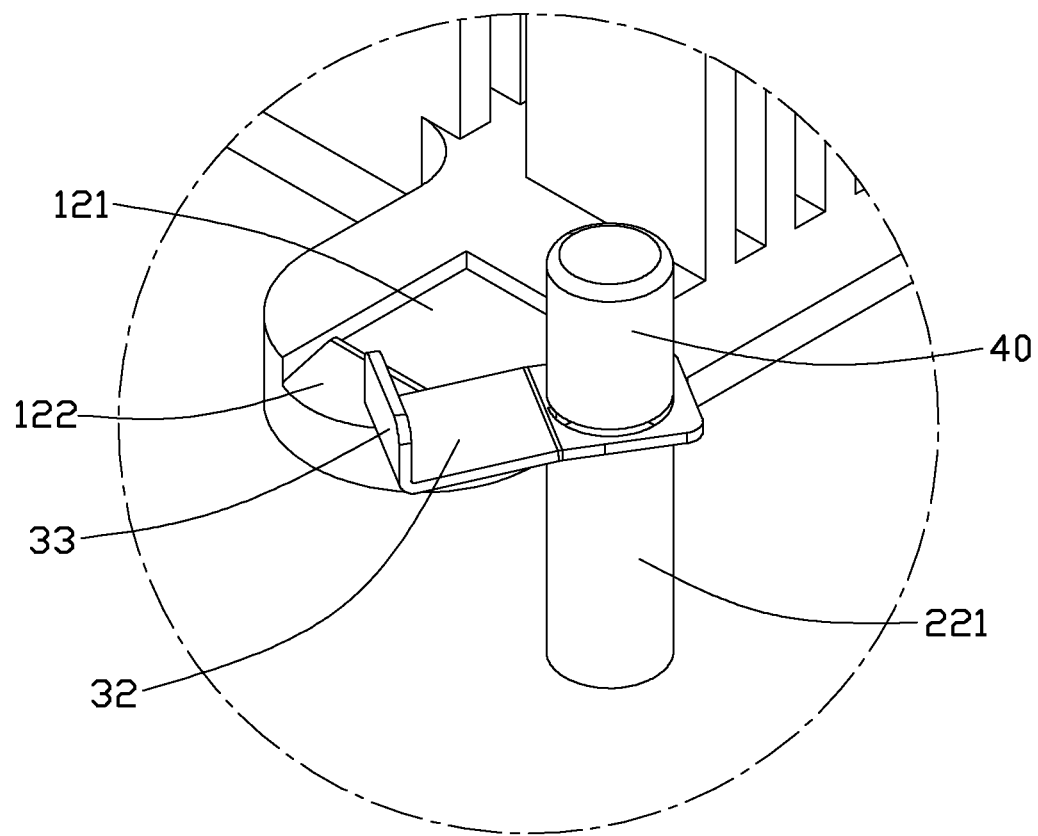
FIG. 5 shows a spring clip in an unlocked position.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIGS. 1-4, show a heat dissipation structure 1 in accordance with an embodiment capable of dissipating heat generated by an electronic component 2, such as a CPU, disposed on a printed circuit board 20. The heat dissipation structure 1 includes a heat sink 10 attached to the printed circuit board 20. In this embodiment, the heat sink 10 includes a base 11 and a plurality of fins 13 secured to the upper surface of the base 11. The lower side of the base 11 is in contact with the top surface of the electronic component 2 and may receive heat from the electronic component 2. The base 11 has four securing tabs 12 laterally extending from two opposite sides of the base 11.

Four positioning posts 22 upwardly protrude from the printed circuit board 20. The four positioning posts 22 are secured to the printed circuit board 20 by welding or other means. If desired, however, the four positioning posts 22 could be die-cast integrally with the printed circuit board 20. The four positioning posts 22 are arranged in four corners of a quadrilateral area, in which the electronic component 2 is nested. Each of the four positioning posts 22 includes a first cylinder 221 and a second cylinder 222 upwardly extending from the top surface side of the first cylinder 221. The second cylinder 222 has a diameter less than that of the first cylinder 221.

Four spring clips 30 are attached to the four positioning posts 22 respectively. Each of the four spring clips 30 includes a resilient piece 32 with a positioning hole 31, in which the second cylinder 222 of a corresponding one of the four positioning posts 22 is received. The positioning hole 31 has a diameter greater than that of the second cylinder 222 and less than that of the first cylinder 221, such that each of the four spring clips 30 is blocked by the top surface side of the first cylinder 221 and is prevented from downwardly moving. Each of the four spring clips 30 is horizontally rotatable about the second cylinder 222. When each of the four spring clips 30 is rotated to a locked position, the resilient piece 32 of each of the four spring clips 30 exerts a downward force to press a corresponding one of the four securing tabs 12 of the base 11, such that the heat sink 10 is secured to the printed circuit board 20, as shown more clearly in FIG. 4.

The heat dissipation structure 1 further includes four securing caps 40. Each of the four securing caps 40 abuts one of the four spring clips 30, such that the four spring clips 30 are sandwiched between the four securing caps 40 and the top surface sides of the first cylinders 221 of the four positioning posts 22. Thereby the four spring clips 30 are prevented from moving upwardly away from the four positioning posts 22. Each of the four securing caps 40 defines a receiving opening 41 for interferentially receiving the second cylinder 222 of a corresponding one of the four positioning posts 22.

In accordance with another embodiment, the positioning hole 31 of each of the four spring clips 30 includes a first portion 311 formed with a first semi-circle and a second portion 312 formed with a second semi-circle having a diameter greater than that of the first semi-circle. The first portion 311 communicates with the second portion 312 and together with the second portion 312 forms the positioning hole 31. Each of the four positioning posts 22 includes an arc-shaped boss 223 upwardly projecting from the top surface side of the first cylinder 221 and surrounding the second cylinder 222, as shown more clearly in FIG. 3. More specifically, the arc-shaped boss 223 presents a quarter of a circle having a diameter substantially identical to that of the first cylinder 221. Thereby each of the four spring clips 30 is restricted to be rotated within a limited angle range about a corresponding one of the four positioning posts 22.

Each of the four securing tabs 12 defines a recess 121 for receiving a free end of the resilient piece 32 of a corresponding one of the four spring clips 30, thereby preventing the free end of the resilient piece 32 from slipping away from each of the four securing tabs 12. Each of the four securing tabs 12 includes a slanted plane 122 adjacent to an exterior side of the recess 121. The slanted plane 122 facilitates a movement of the resilient piece 32 of a corresponding one of the four spring clips 30 slipping into the recess 121.

According to some embodiments, each of the four spring clips 30 includes a handling portion 33 formed by bending a free end of the resilient piece 32 along a vertical direction. The handling portion 33 is operable to actuate each of the four spring clips 30 to rotate about a corresponding one of the four positioning posts 22.

In assembly, the four spring clips 30 are attached to the four positioning posts 22 respectively by inserting the second cylinder 222 into the positioning hole 31 until the resilient piece 32 is blocked by the top surface side of the first cylinder 221. The second cylinder 222 is then inserted into the receiving opening 41 of a corresponding one of the four securing caps 40 until the securing cap 40 abuts the resilient piece 32 of a corresponding one of the four spring clips 30. Thereby the four spring clips 30 are prevented from moving away from the four positioning posts 22, but rotatable about the four positioning posts 22 respectively.

Figure 6:
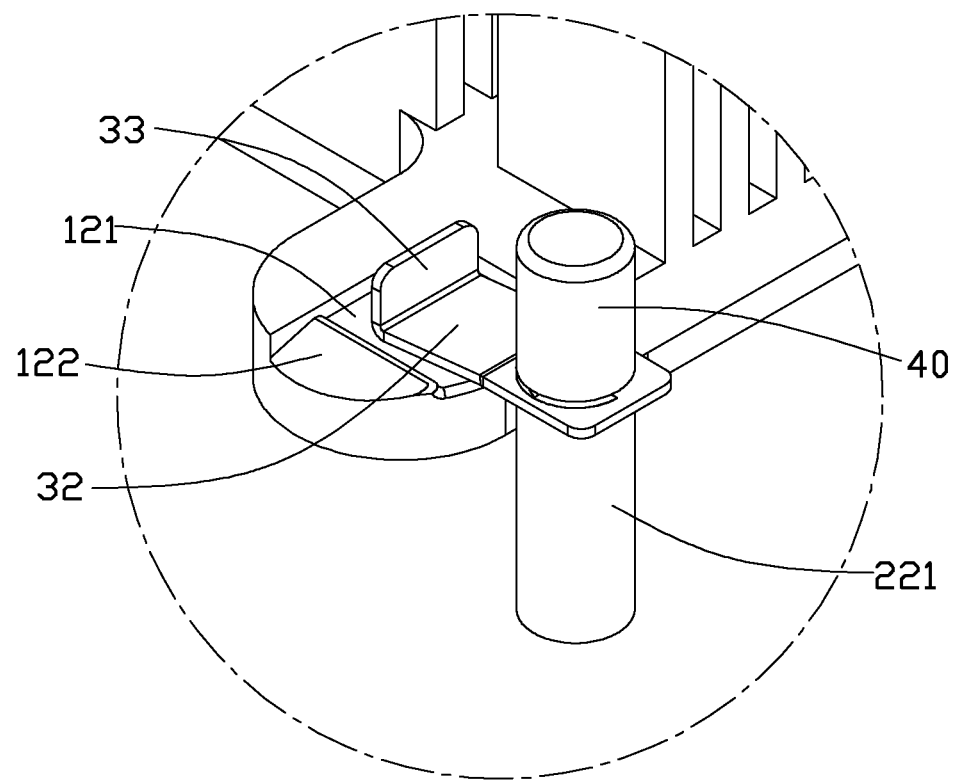
FIG. 6 is similar to FIG. 5 and is an enlarged view of circled portion VI of FIG. 4, but shows the spring clip in a locked position.

When mounting the heat sink 10 to the printed circuit board 20; the heat sink 10 is lifted downwardly and placed onto the electronic component 2, such that the base 11 of the heat sink 10 is in contact with the upper surface of the electronic component 2. Each of the four spring clips 30 is rotated towards a corresponding one of the four securing tabs 12 and then is slipped along the slant plane 122 of the corresponding one of the four securing tabs 12 by actuating the handling portion 33 of each of the four spring clips 30, until the free end of the resilient piece 32 of each of the four spring clips 30 is seated in the recess 121 of the corresponding one of the four securing tabs 12, as shown more clearly in FIG. 6. The resilient piece 32 of each of the four spring clips 30 exerts a downward force to press a corresponding one of the four securing tabs 12 of the base 11, thereby securing the heat sink 10 to the printed circuit board 20. The four spring clips 30 may be rotated and then moved laterally to disengage and to clear the resilient pieces 32 from the four securing tabs 12 of the base 11, and thereafter the heat sink 10 may be lifted upwardly and away from the printed circuit board 20.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A heat dissipation structure, comprising:
a heat sink comprising a base comprising four securing tabs, each of the four securing tabs laterally extending from each corner of the base and each of the four securing tabs defines a recess;
a printed circuit board comprising four positioning posts upwardly projecting from the printed circuit board, in a projected view of the printed circuit board, each of the four securing tabs is adjacent a corresponding one of the four positioning posts; and
four spring clips, each of the four spring clips being attached to the corresponding one of the four positioning posts and each of the four spring clips is restricted to be rotated within a limited angle range about the corresponding one of the four positioning posts, wherein each of the four spring clips comprises a resilient piece,
wherein when the resilient piece is rotated into the recess of a respective one of the four securing tabs, each of the four spring clips exerts a downward force and presses the respective one of the four securing tabs, thereby securing the heat sink to the printed circuit board.

2. The heat dissipation structure of claim 1, wherein the resilient piece defines a positioning hole configured to receive the corresponding one of the four positioning posts.

3. The heat dissipation structure of claim 2, wherein each of the four spring clips is rotatable about the corresponding one of the four positioning posts.

4. The heat dissipation structure of claim 3, wherein each of the four positioning posts comprises a first cylinder and a second cylinder upwardly extending from a top surface side of the first cylinder, a diameter of the second cylinder being less than a diameter of the first cylinder.

5. The heat dissipation structure of claim 4, wherein the second cylinder is received in the positioning hole and a respective one of the four spring clips is blocked by the top surface side of the first cylinder.

6. The heat dissipation structure of claim 5, wherein the positioning hole comprises a first portion defining a first semi-circle and a second portion defining a second semi-circle, a diameter of the second semi-circle being greater than a diameter of the first semi-circle; the first portion communicates with the second portion; and the first portion and the second portion define the positioning hole.

7. The heat dissipation structure of claim 6, wherein each of the four positioning posts comprises an arc-shaped boss upwardly projecting from the top surface side of the first cylinder and surrounding the second cylinder.

8. The heat dissipation structure of claim 7, wherein the arc-shaped boss defines a quarter of a circle having a diameter substantially identical to the diameter of the first cylinder.

9. The heat dissipation structure of claim 4, further comprising four securing caps, each of the four securing caps abutting a respective one of the four spring clips, each of the four spring clips being sandwiched between a corresponding one of the four securing caps and the top surface side of the first cylinder, thereby the respective one of the four spring clips being prevented from moving upwardly away from the corresponding one of the four positioning posts.

10. The heat dissipation structure of claim 9, wherein each of the four securing caps defines a receiving opening, the receiving opening being configured to interferentially receive the second cylinder.

11. The heat dissipation structure of claim 1, wherein the recess being configured to receive a free end of the resilient piece thereby the free end of the resilient piece is prevented from slipping away from the respective one of the four securing tabs.

12. The heat dissipation structure of claim 11, wherein each of the four securing tabs comprises a slant plane adjacent to an exterior side of the recess, the slant plane being configured to facilitate the resilient piece to slip into the recess of the respective one of the four securing tabs.

13. The heat dissipation structure of claim 1, wherein each of the four spring clips comprises a handling portion formed by bending a free end of the resilient piece along a vertical direction, the handling portion is adapted to rotate a respective one of the four spring clips about the corresponding one of of the four positioning posts.

14. A heat sink mounting apparatus for mounting a heat sink on a printed circuit board, the heat sink mounting apparatus comprising:
the heat sink comprises a base formed comprising four securing tabs, each of the four securing tabs laterally extending from each corner of the base and each of the four securing tabs defines a recess;
four positioning posts secured to the printed circuit board and each of the four positioning posts being located in a respective corner of a quadrilateral, in a projected view of the printed circuit board, each of the four securing tabs is adjacent a corresponding one of the four positioning posts; and four spring clips, each of the four spring clips being attached to the corresponding one of the four positioning posts and each of the four spring clips is restricted to be rotated within a limited angle range about the corresponding one of the four positioning posts, wherein each of the four spring clips comprises a resilient piece defining a positioning hole, the positioning hole being configured to receive the corresponding one of the four positioning posts, wherein when the resilient piece is rotated into the recess of a respective one of the four securing tabs, each of the four spring clips exerts a downward force and presses the respective one of the four securing tabs, thereby securing the heat sink to the printed circuit board.

15. The heat sink mounting apparatus of claim 14, wherein each of the four positioning posts comprises a first cylinder and a second cylinder upwardly extending from a top surface side of the first cylinder, a diameter of the second cylinder being less than a diameter of the first cylinder; the second cylinder is received in the positioning hole; and a respective one of the four spring clips is blocked by the top surface side of the first cylinder.

16. The heat sink mounting apparatus of claim 15, wherein the positioning hole comprises a first portion defining a first semi-circle and a second portion defining a second semi-circle, a diameter of the second semi-circle being greater than a diameter of the first semi-circle; the first portion communicates with the second portion; and the first portion and the second portion define the positioning hole.

17. The heat sink mounting apparatus of claim 16, wherein each of the four positioning posts comprises an arc-shaped boss upwardly projecting from the top surface side of the first cylinder and surrounding the second cylinder, the arc-shaped boss defining a quarter of a circle having a diameter substantially identical to the diameter of the first cylinder.

18. The heat sink mounting apparatus of claim 15, further comprising four securing caps, each of the four securing caps abutting a respective one of the four spring clips, each of the four spring clips being sandwiched between a corresponding one of the four securing caps and the top surface side of the first cylinder thereby the respective one of the four spring clips being prevented from moving upwardly away from the corresponding one of the four positioning posts.

19. The heat sink mounting apparatus of claim 18, wherein each of the four securing caps defines a receiving opening, the receiving opening being configured to interferentially receive the second cylinder.

20. The heat sink mounting apparatus of claim 14, wherein each of the four spring clips comprises a handling portion formed by bending a free end of the resilient piece along a vertical direction, the handling portion is adapted to rotate a respective one of the four spring clips about the corresponding one of the four positioning posts.

* * * * *